(12) United States Patent
Shirai

(10) Patent No.: US 8,557,611 B2
(45) Date of Patent: Oct. 15, 2013

(54) MANUFACTURING METHOD OF SEMICONDUCTOR DEVICE, EXPOSURE METHOD, AND EXPOSURE APPARATUS

(75) Inventor: Seiichiro Shirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 69 days.

(21) Appl. No.: 13/305,858

(22) Filed: Nov. 29, 2011

(65) Prior Publication Data

US 2012/0156809 A1 Jun. 21, 2012

(30) Foreign Application Priority Data

Dec. 15, 2010 (JP) .............................. 2010-279065

(51) Int. Cl.
*H01L 21/00* (2006.01)
*G01J 3/00* (2006.01)

(52) U.S. Cl.
USPC .......................................... 438/7; 250/504 R

(58) Field of Classification Search
None
See application file for complete search history.

(56) References Cited

U.S. PATENT DOCUMENTS

| | | | |
|---|---|---|---|
| 7,098,466 B2* | 8/2006 | Chandhok et al. | 250/492.2 |
| 7,362,416 B2* | 4/2008 | Ito et al. | 355/67 |
| 7,580,110 B2* | 8/2009 | Kondo et al. | 355/35 |
| 2002/0041368 A1* | 4/2002 | Ota et al. | 355/55 |
| 2003/0098959 A1* | 5/2003 | Hagiwara et al. | 355/69 |
| 2003/0142410 A1* | 7/2003 | Miyake | 359/619 |
| 2006/0091328 A1* | 5/2006 | Kanazawa | 250/504 R |
| 2007/0181834 A1* | 8/2007 | Kleinschmidt | 250/504 R |
| 2009/0072167 A1* | 3/2009 | Kanazawa | 250/504 R |
| 2010/0140512 A1* | 6/2010 | Suganuma et al. | 250/504 R |
| 2010/0193712 A1* | 8/2010 | Tawarayama | 250/504 R |

FOREIGN PATENT DOCUMENTS

JP 2007-109451 A 4/2007

* cited by examiner

*Primary Examiner* — Scott B Geyer
(74) *Attorney, Agent, or Firm* — Mattingly & Malur, PC

(57) ABSTRACT

An exposure apparatus includes a light emission part 10 generating EUV light by plasma excitation of a predetermined atom, a condenser part 20 condensing the EUV light emitted from the light emission part, an exposure part 30 irradiating a substrate via a mask with the EUV light condensed by the condenser part, a first plasma position monitor 11a detecting the position of an emission point of the EUV light within the light emission part, and a light emission part drive unit 13 adjusting the position of the light emission part. The exposure apparatus determines a first shift amount between the emission point detected by the plasma position monitor and a reference light emission position, and drives the light emission part drive unit according to the first shift amount.

23 Claims, 13 Drawing Sheets

Δd=0.25mm

| θ (degree) | Lmin(mm) |
|---|---|
| 0.1 | 143.2 |
| 0.2 | 71.6 |
| 0.3 | 47.7 |
| 0.4 | 35.8 |
| 0.5 | 28.6 |
| 0.6 | 23.9 |
| 0.7 | 20.5 |
| 0.8 | 17.9 |
| 0.9 | 15.9 |
| 1.0 | 14.3 |

$\Delta h = L \times \tan \phi$

MANUFACTURING METHOD OF SEMICONDUCTOR DEVICE, EXPOSURE METHOD, AND EXPOSURE APPARATUS

CROSS-REFERENCE TO RELATED APPLICATION

The disclosure of Japanese Patent Application No. 2010-279065 filed on Dec. 15, 2010 including the specification, drawings and abstract is incorporated herein by reference in its entirety.

BACKGROUND

The present invention relates to a manufacturing method of a semiconductor device, an exposure method, and an exposure apparatus, and specifically relates to a manufacturing technique of a semiconductor device including an exposure step using EUV light.

In a manufacturing process of a semiconductor device, the lithography (exposure and development) technique is used as a technique of forming a pattern on a principal surface of a semiconductor substrate (wafer). A projection exposure apparatus is mainly used for this lithography, and a mask pattern formed on the photo-mask is transferred onto the resist by irradiating resist coated on the principal surface of the wafer with exposure light transmitted through a mask (original copy) mounted on this projection exposure apparatus.

Recently, a higher integration of a semiconductor element and a higher operation speed of the semiconductor element have been required and pattern miniaturization has been developed to satisfy these requirements. Further, to satisfy this requirement of miniaturization, effort to improve resolution of a projected image has been promoted by using a shorter wavelength for an exposure light wavelength. For example, a lithography technique which uses EUV (Extreme Ultra-Violet) light having a wavelength of 13.5 nm one digit or more shorter than the ultra-violet laser region of KrF (248 nm) and ArF (193 nm) in the related art has been studied.

For example, Japanese Patent Laid-Open No. 2007-109451 (Patent Document 1) discloses an initial alignment method of an extreme ultra-violet light source apparatus as follows. First, a first positional reference element is disposed at an ideal emission point and a second positional reference element is disposed at an ideal focus. Next, a light path of first optical axis adjustment light is adjusted so that first optical axis adjustment light passes through the first positional reference element and the second positional element, and also a light path of second optical axis adjustment light is adjusted so that the second optical axis adjustment light passes through the first positional reference element and does not pass through the second positional reference element. Further, the light path of laser light is adjusted so that the laser light irradiates the first positional reference element and also a target material is aligned so that the target material passes through a cross point of the first optical axis adjustment light and the second optical axis adjustment light. After that, the position and posture of a condenser mirror is adjusted so that extreme ultra-violet light generated from plasma is condensed at the second positional reference element by the condenser mirror.

SUMMARY

The present inventors are engaged on research and development of an exposure technique using the EUV light. The exposure technique using the EUV light is difficult to keep strength of a light source compared with an exposure technique using a KrF (248 nm) or ArF (193 nm) laser in the related art.

Accordingly, guiding the generated EUV light to the mask (original copy) without attenuation as far as possible improves exposure characteristics such as resolution and throughput.

Accordingly, an object of the present invention is to provide a manufacturing method of a semiconductor device which is capable of improving the exposure characteristics and moreover semiconductor device characteristics.

Further, another object of the present invention is to provide a manufacturing method of a semiconductor device which is capable of improving the exposure characteristics and moreover the throughput.

The description of the present specification and the accompanying drawings clarify the above purposes, the other purposes, and the new features of the present invention.

The following explains briefly the outline of representative inventions among the inventions disclosed in the present application.

A manufacturing method of a semiconductor device shown in a representative embodiment among the inventions disclosed in the present application includes the steps of (a) preparing an exposure apparatus which has (a1) a light emission part generating EUV light by plasma excitation of a predetermined atom and (a2) a condenser part condensing the EUV light emitted from the light emission part. The manufacturing method includes the step of preparing the exposure apparatus which further has (a3) an exposure part irradiating a substrate via a mask with the EUV light condensed by the condenser part; (a4) a monitor detecting the position of an emission point of the EUV light within the light emission part; and (a5) a drive part adjusting the position of the light emission part. The manufacturing method further includes the steps of (b) adjusting the exposure apparatus: the adjusting step includes the steps of (b1) generating the EUV light in the light emission part; (b2) detecting the emission point of the EUV light by the monitor; and (b3) calculating a shift amount between the emission point and a reference emission point. The manufacturing method still further includes the step of (b4) adjusting the position of the emission point of the EUV light by driving the drive part according to a calculation result of the shift amount; and (c) exposing a light sensitive film formed above the substrate, the exposing step: after the (b4) step, guiding corrected EUV light, which has been emitted from the light emission part and condensed by the condenser part, to the exposure part to expose the light sensitive film within the exposure part.

A manufacturing method of a semiconductor device shown in a representative embodiment among the inventions disclosed in the present application includes the step of (a) preparing an exposure apparatus which has (a1) a light emission part generating EUV light by plasma excitation of a predetermined atom and (a2) a condenser part condensing the EUV light emitted from the light emission part. The manufacturing method includes the step of preparing the exposure apparatus which further has (a3) an exposure part irradiating a substrate via a mask with the EUV light condensed by the condenser part; (a4) a monitor detecting the position of a focus of the EUV light condensed by the condenser part; and (a5) a drive part adjusting the position of the condenser part. The manufacturing method further includes the step of (b) adjusting the exposure apparatus: the adjusting step includes the steps of (b1) generating the EUV light in the light emission part; (b2) detecting the focus of the EUV light by the monitor; and (b3) calculating a shift amount between the focus and a reference focus. The manufacturing method still further includes the steps of (b4) adjusting the position of the focus of the EUV light by driving the drive part according to a calculation result of the shift amount, and (c) exposing a light sensitive film formed above the substrate, the exposing step: after the (b4) step, guiding corrected EUV light, which has been emitted from the light emission part and condensed by the condenser part, to the exposure part to expose the light sensitive film within the exposure part.

An exposure apparatus shown in a representative embodiment among the inventions disclosed in the present application includes: a light emission part generating EUV light by plasma excitation of a predetermined atom; a condenser part condensing the EUV light emitted from the light emission part; and an exposure part irradiating a substrate via a mask with the EUV light condensed by the condenser part. The exposure apparatus further includes a first monitor detecting the position of an emission point of the EUV light within the light emission part, and a first drive part adjusting the position of the light emission part. Then, the exposure apparatus determines a first shift amount between the emission point detected by the first monitor and a reference emission point and drives the first drive part according to the first shift amount.

An exposure method shown in a representative embodiment among the inventions disclosed in the present application uses an exposure apparatus including: a light emission part generating EUV light by plasma excitation of a predetermined atom; a condenser part condensing the EUV light emitted from the light emission part; and an exposure part irradiating a substrate via a mask with the EUV light condensed by the condenser part. The exposure method uses the exposure apparatus further including a monitor detecting the position of an emission point of the EUV light within the light emission part, and a drive part adjusting the position of the light emission part. Then the exposure apparatus determines a shift amount between the emission point detected by the monitor and a reference emission point and drives the drive part according to the shift amount.

According to the manufacturing method of a semiconductor devices shown in the following representative embodiments among the inventions disclosed in the present application, the semiconductor device characteristics can be improved.

Further, according to the manufacturing method of a semiconductor devices shown in the following representative embodiments among the inventions disclosed in the present application, the throughput of a semiconductor device can be improved.

According to the exposure apparatuses shown in the following representative embodiments among the inventions disclosed in the present application, the exposure characteristics can be improved.

According to the exposure methods shown in the following representative embodiments among the inventions disclosed in the present application, the exposure characteristics can be improved.

DETAILED DESCRIPTION

Figure 1:
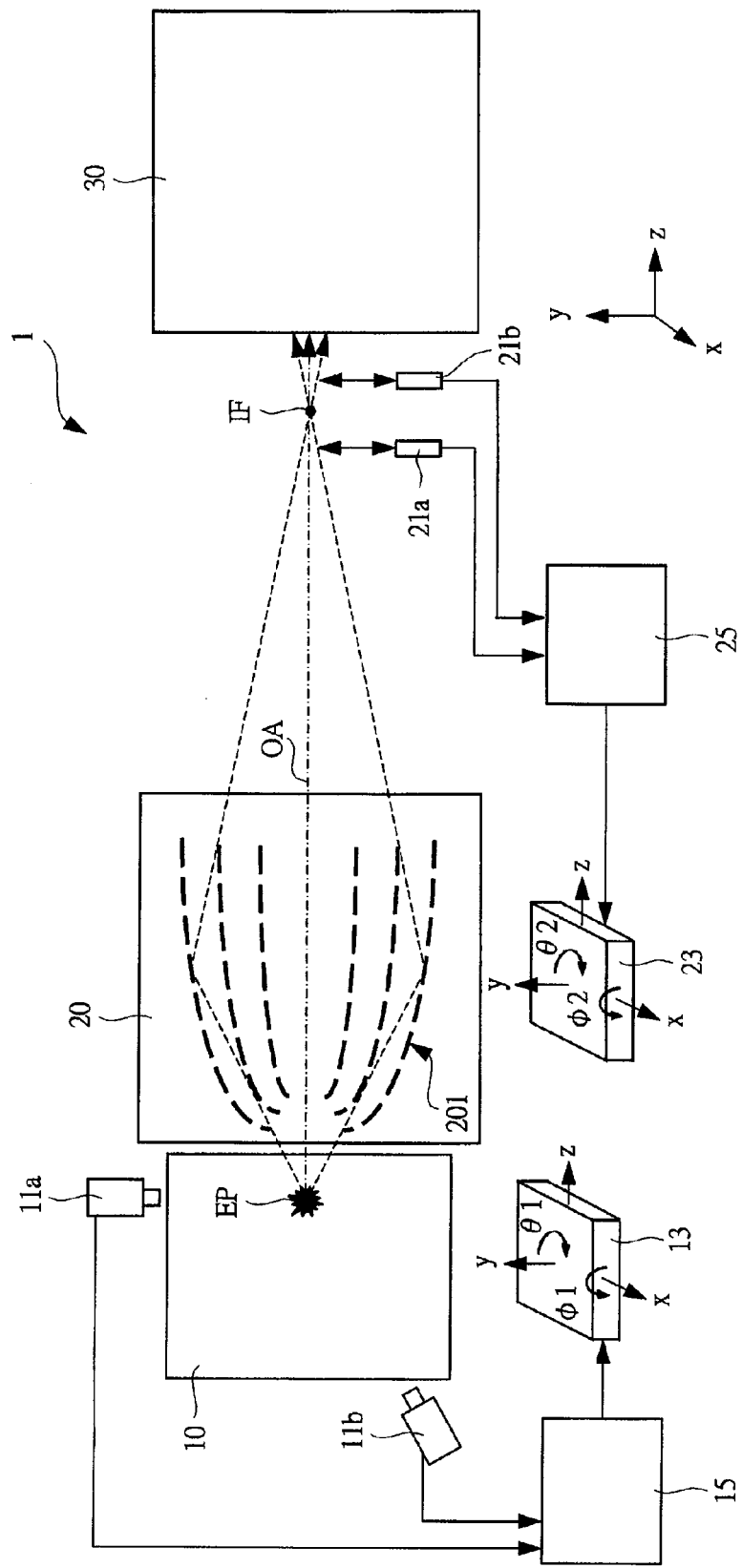
FIG. 1 is a block diagram showing a configuration of an exposure apparatus used for semiconductor device production in embodiment 1.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. Further, in the following explanation, when the number of elements (including the number, a numeric value, an amount, and a range) is referred to, they may be not restricted to the specific number but may be greater or smaller than the specific number, except for the case where they are clearly specified in particular and where they are clearly restricted to a specific number theoretically.

Further, in the following embodiments, an element (including an element step) is not necessarily indispensable, except for the case where it is clearly specified in particular and where it is considered to be clearly indispensable from theoretically. Similarly, in the following embodiments, when shape, position relationship, etc. of an element etc. are referred to, what resembles or is similar to the shape substantially shall be included, except for the case where it is clearly specified in particular and where it is considered to be clearly not right theoretically. This statement also applies to the above described number (including the number, a numeric value, an amount, and a range).

The following explains embodiments of the present invention in detail according to the drawings. In all the drawings for explaining the embodiments, the same or related symbol is attached to a member having the same function and its explanation is not repeated. Further, in the following embodiments, explanation of the same or similar part is not repeated as a principle except for the case where it is necessary in particular.

Further, in the drawings used in the embodiments, hatching may be omitted to clarify the drawing even if it is a cross-sectional view. Moreover, hatching may be attached to clarify the drawing even if it is a plan view.

(Embodiment 1) The following explains a configuration of an exposure apparatus used in a manufacturing method of a semiconductor device of the present embodiment and an exposure method using the exposure apparatus with reference to the drawings.

[Explanation of an exposure apparatus configuration] FIG. 1 is a block diagram showing a configuration of an exposure apparatus used for semiconductor device production in the present embodiment.

The exposure apparatus shown in FIG. 1 includes a light emission part 10, a condenser part 20, and an exposure part 30.

The light emission part 10 generates EUV light from Xe (xenon) plasma gas. EP indicates an emission point of the EUV light in the light emission part 10. Plasma position monitors (emission point monitors) 11a and 11b are disposed outside the light emission part 10. The first plasma position monitor 11a is disposed on the top of the light emission part 10 which is almost cuboid and the second plasma position monitor 11b is disposed on the side of the light emission part 10 opposite to the condenser part 20. Sn (tin) plasma gas may be used as plasma gas other than the Xe plasma gas.

A reference emission point EPd in the light emission part 10 and a reference focus (reference intermediate focus) IFd of the condenser part 20 are determined preliminarily and the light emission part 10, the condenser part 20, and the exposure part 30 are disposed most appropriately so that the condenser part 20 condenses the EUV light emitted from the reference emission point EPd in the light emission part 10 at the reference focus IFd. A line connecting the reference emission point EPd and the reference focus IFd is called a reference optical axis OAd. The "optical axis" means a center light beam of a light flux passing through an entire system or a path through which the center light beam of the light flux passes.

Each of the reference focus IFd, the reference emission point EPd, and the reference optical axis OAd is an ideal position (point or axis) as a reference to dispose the light emission part 10, the condenser part 20, and the exposure part 30 most appropriately. Among these references, the coordinates of the reference focus IFd is expressed by (xd, yd, zd) and the coordinates of the reference emission point EPd is expressed by (xd, yd, zd2). Zd2 is zd+zfp. zfp is a distance from the reference focus IFd to the reference emission point EPd. Further, the reference optical axis OAd can be expressed by a function (straight line) passing through the coordinates (xd, yd, zd) of the reference focus IFd and the coordinates (xd, yd, zd2) of the reference emission point EPd.

However, since an actual focus, emission point, and optical axis could shift from the ideal positions, these actual positions are expressed as an actual emission point EP, actual focus IF, and actual optical axis OA, respectively. These positions are sometimes expressed simply as "emission point EP", "focus IF", and "optical axis OA", respectively.

The condenser part 20 condenses the EUV light generated by the light emission part 10 at the focus (intermediate focus) IF. The light condensed at this focus IF is guided to the exposure part 30 and a light sensitive film on a semiconductor substrate is irradiated with the light via a reticle (mask, photo mask, or original mask). Details are described below.

Figure 2:
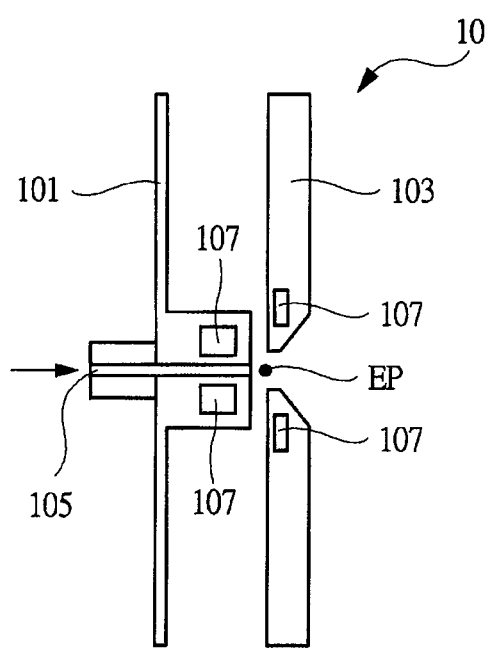
FIG. 2 is a cross-sectional view showing an example of a light emission part configuration.
Figure 3:
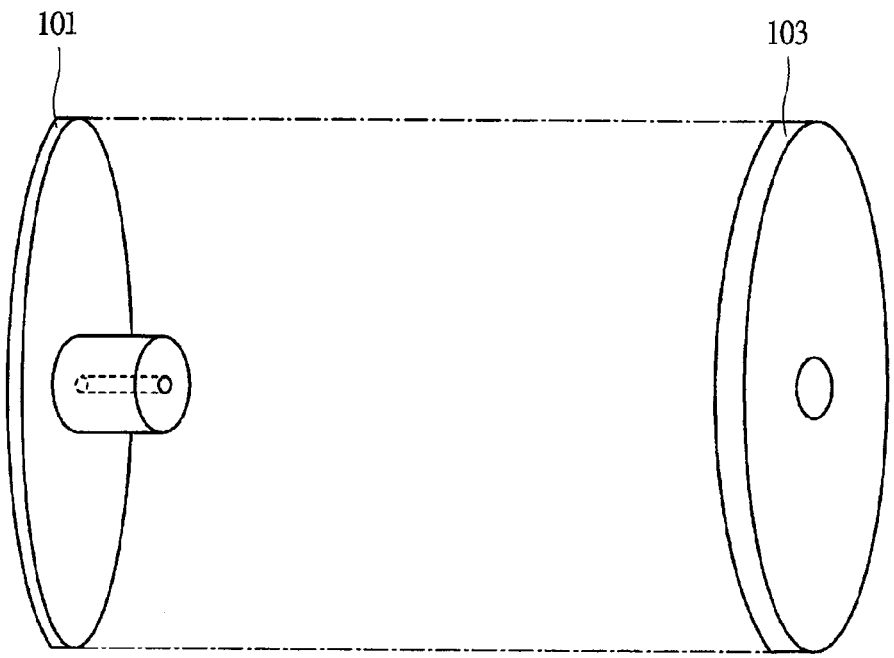
FIG. 3 shows a perspective view of the negative pole of FIG. 2 in the left drawing and a perspective view of the positive pole of FIG. 2 in the right drawing.

While the configuration of the light emission part 10 does not have any particular restriction, FIG. 2 and FIG. 3 show an example of the configuration of the light emission part 10. The left drawing of FIG. 3 is a perspective view showing the negative pole in FIG. 2 and the right drawing of FIG. 3 is a perspective view showing the positive pole in FIG. 2.

As shown in FIG. 2, the light emission part 10 includes the negative pole (negative electrode or anode electrode) 101 and the positive pole (positive electrode or cathode electrode) 103. The negative pole 101 is disposed in cylinder to surround a gas supply hole 105 at the center part and the positive pole 103 is disposed in flat-plate ring having an opening at a part corresponding to the gas supply hole 105. Applying a high electric field between the positive pole 103 and the negative pole 101 turns source gas (Xe) into plasma and plasma conduction generates the EUV light of 13.5 nm, for example, at a part where the positive pole 103 and the negative pole 101 face each other. The negative pole 101 and the positive pole 103 include cooling pipes 107 and cooling medium (cooling water or cooling gas) flowing within the cooling pipes 107 regulates temperature rise of the negative pole 101 and the positive pole 103. Such a configuration is disposed within the chamber (processing room) which is almost cuboid and not in FIG. 2 and a pressure reduction means which is not in the drawing is disposed so as to cause the chamber to have a reduced-pressure (vacuum) state.

Figure 4:
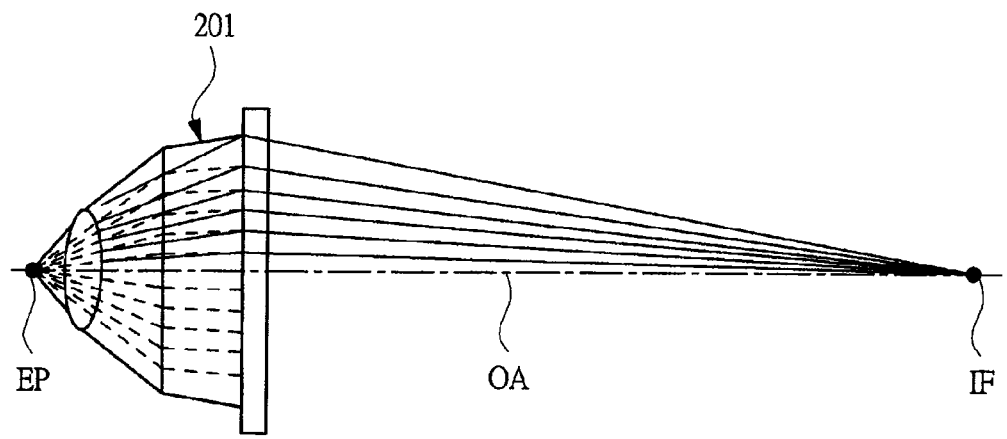
FIG. 4 is a cross-sectional view showing an example of a collector (condenser optical system)
Figure 5:
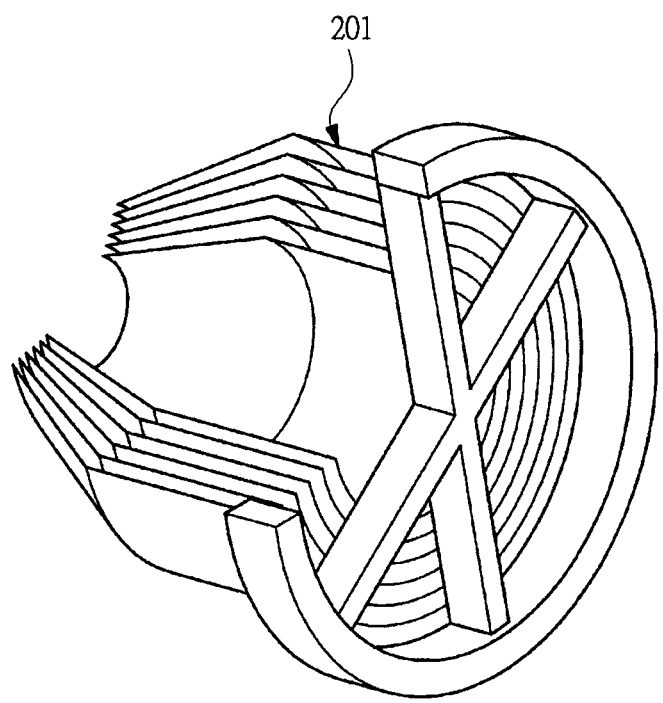
FIG. 5 is a perspective view showing an example of a collector (condenser optical system)

While the configuration of the condenser part 20 does not have any particular restriction, for example, the EUV light can be condensed by a reflection mirror disposed symmetrically to the reference optical axis OAd. FIG. 4 and FIG. 5 show an example of a collector (condenser optical system). In particular, condensation efficiency can be improved by using the collector (condenser optical system) 201 in which cylindrical reflection mirrors are stacked at predetermined intervals as shown in FIG. 4 and FIG. 5. EUV light intensity can be increased at the focus IF.

One of the reflection mirrors shown in FIG. 4 has a side-view shape of a circular cone and has a combined shape of a first side-plane having a first inclined angle and a second side-plane having a second inclined angle which is smaller than the first inclined angle. One of the reflection mirrors may have a cross-sectional shape which is almost ellipsoid. FIG. 1 schematically shows the collector 201 which stacks the reflection mirrors each of which has a cross section which is almost ellipsoid. While the composition material of the reflection mirror does not have any particular restriction, preferably a multilayer film mirror using a stacked film of Mo (molybdenum) and Si (silicon) is used, for example. The EUV light can be reflected efficiently by alternately stacking materials which have respective refraction indexes slightly different from each other in this manner. Further, a DMT (Debris Shield Tool) or the like may be provided between the emission point EP and the collector 201. Debris can be removed by this DMT and light condensation can be improved.

In the exposure part 30, a photo-resist film formed above the semiconductor substrate is irradiated with the condensed EUV light via the reticle, and a pattern depicted on the reticle is transferred onto the photo-resist film. The reticle may be irradiated directly with the condensed EUV light or via a reflection mirror.

[Detailed configuration in the peripheral of the light emission part] In the exposure apparatus of the present embodiment (FIG. 1), the first plasma position monitor 11a is disposed on the top of the light emission part 10. Further, the second plasma position monitor 11b is disposed on the side of the light emission part 10 opposite to the condenser part 20. A CCD (Charge Coupled Device) camera can be used as this plasma position monitor (monitor detecting a light emission position), for example. Further, a light emission part drive unit 13 is disposed on the bottom face of the light emission part 10 to control the position of the light emission part 10. Data (for example, image data showing a cross section of light flux to be described below) obtained from the first and second plasma position monitors 11a and 11b is transmitted to a light emission part drive control unit 15, and the light emission part drive control unit 15 calculates each of the coordinates of the actual emission point EP by analyzing the data, calculates a shift amount of the coordinate of the actual emission point, and then drives the light emission drive part unit 13 to compensate the shift amount.

The first plasma position monitor 11a is disposed to face a window part (EUV light transmission part) disposed on the top of the light emission part 10 and detects the position of the emission point EP through the window part. The second plasma position monitor 11b is disposed to face a window part (EUV light transmission part) disposed on the side of the light emission part 10 opposite to the condenser part 20 and detects the position of the emission point EP through the window part. For example, the first plasma position monitor 11a detects the x-coordinate and the z-coordinate of the emission point EP and the second plasma position monitor 11b detects the y-coordinate of the emission point EP. The second plasma position monitor 11b may detect the x-coordinate of the emission point EP. In this manner, disposing the first and second plasma position monitors 11a and 11b outside the light emission part (chamber) 10 can reduce the influence of temperature rise due to the plasma excitation. Further, this can avoid complication of the inner configuration in the light emission part 10.

Further, while the detection method does not have any particular restriction, the image data is obtained for a predetermined region (for example, 2 by 2 cm square) with the center set at the reference emission point (xd, yd, zd2), for example. The analysis is performed by assuming that the actual emission point (x1, y1, z1) has coordinates providing the largest light intensity or center coordinates of a region having the largest light intensity, for example. The image data of the predetermined region may be obtained by scanning the predetermined region (for example, 2 by 2 cm square) with the monitor. For example, the image data of the predetermined region may be obtained by scanning with the first plasma position monitor 11a in the x-direction and the z-direction and by scanning with the second plasma position monitor 11b in the y-direction and the z-direction.

Further, the detection may be performed by changing the wavelength at the emission point (EUV light: 13.5 nm) EP via a filter. For example, the detection may be performed via a visualization filter. The filter may be disposed on the surface of each lens of the monitors (11a and 11b) or may be disposed outside the window part. A stacked filter including a first filter composed of a stacked film of Ru (ruthenium) and Si (silicon) and a second filter composed of a stacked film of YAG (Yttrium Aluminum Garnet) and Ce (cerium) can be used as the visualization filter. For example, the EUV light is converted into visible light by the first filter and the second filter. This visible light may be detected by each of the plasma position monitors (11a and 11b).

Further, while the configuration of the light emission part drive unit 13 does not have any particular restriction, the light emission part drive unit (drive unit adjusting the position of the light emission part) 13 may be regarded as a stage (mounting stage) which can move in the x, y, and z directions and the whole light emission part 10 (entire chamber) may be mounted on the upper part of the stage. Moreover, the stage may be disposed to be rotatable (axis supported) having a center axis in the x-direction and may be disposed to be rotatable (axis supported) having a center axis in the y-direction. A counter clockwise rotation angle around the center axis of the x-direction from a horizontal state (correction rotation angle or rotational shift amount) is defined as $\phi 1$ and a clockwise rotation angle around the center axis of the y-direction from the x-direction is defined as $\theta 1$.

[Adjustment method of the emission point] Next, an adjustment method of the emission point EP is explained. While the adjustment of the emission point EP does not have any particular restriction, the position of the emission point EP can be adjusted by a method shown below, for example.

The data (image data) obtained by the first plasma position monitor 11a and the second plasma position monitor 11b is transmitted to the light emission part drive control unit 15 and coordinates (x1, y1, z1) of the actual emission point are detected by data analysis.

Next, the shift amount between the reference emission point (xd, yd, zd2) and the actual emission point (x1, y1, z1) is calculated.

The light emission part drive unit (stage) is moved according to the calculation result. For example, the light emission part drive unit is moved in the x-direction by amount (xd−x1), in the y-direction by amount (yd−y1), and further in the z-direction by amount (zd2−z1).

In this manner, moving the position of the light emission part 10 can adjust (correct) the position of the actual emission point EP to bring the position closer to the reference emission point EPd.

[Detailed configuration of the condenser part and the peripheral of the focus IF] In the exposure apparatus of the present embodiment (FIG. 1), a condenser part drive unit 23 is disposed on the bottom of the condenser part 20 to control the position of the condenser part (light condensing optical system) 20. Further, a first focus-position monitor 21a and a second focus-position monitor 21b are disposed near the focus IF.

The first focus-position monitor 21a is disposed below the reference optical axis OAd and closer to the condenser part 20 than the second focus-position monitor 21b. Further, the second light focus-position monitor 21b is disposed below the reference optical axis OAd and closer to the exposure part 30 than the first focus-position monitor 21a. Preferably the z-coordinates of the first focus-position monitor 21a and the second focus-position monitor 21b are disposed on both sides of the z-coordinate (zd2) of the reference focus IFd, respectively. A CCD camera may be used as each of these focus-position monitors 21a and 21b, for example.

The first and second focus-position monitors 21a and 21b are disposed so that they can move up and down (vertically), and each of the monitors is raised up to near the reference optical axis OAd and detects data (for example, image data showing a cross section of light flux near the reference optical axis OAd).

Figure 6:
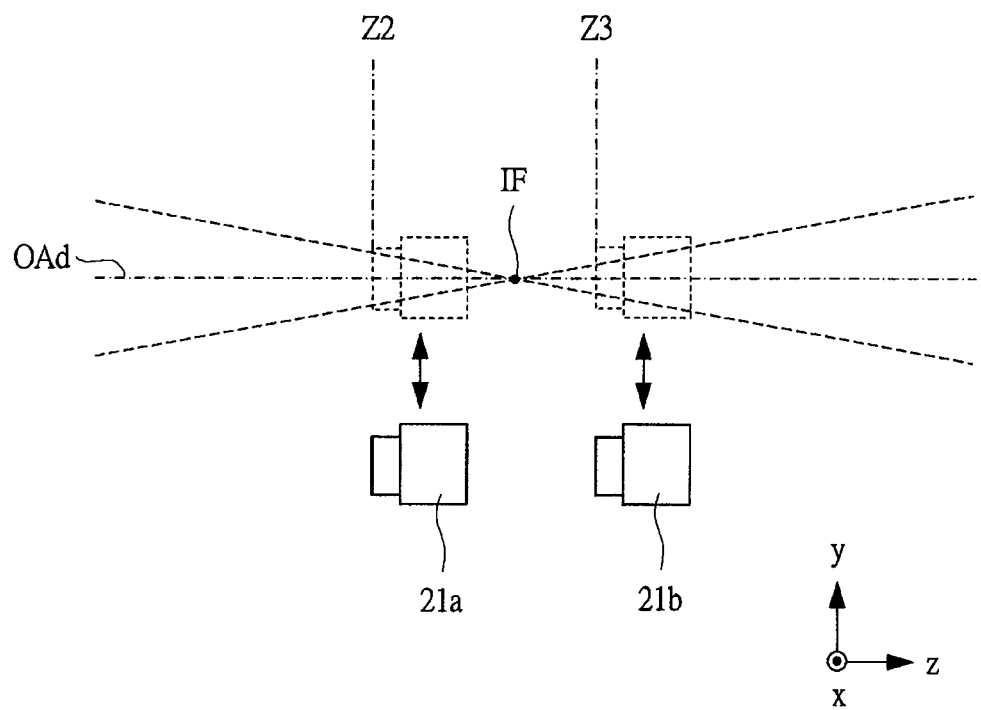
FIG. 6 is a diagram showing a configuration in the vicinity of a focus in an exposure apparatus of embodiment 1.

FIG. 6 is a diagram showing a configuration near the focus in the exposure apparatus of the present embodiment. While the detection method does not have any particular restriction, for example, as shown in FIG. 6, the first focus-position monitor 21a is raised to cross the reference optical axis OAd at a predetermined position in the z-direction which is the extension direction of the reference optical axis OAd (z-coordinate of this point is denoted by z2) and obtains the image data of a predetermined region (for example, 2 by 2 cm square) having the center at the point of the x-coordinate and the y-coordinate of the reference optical axis OAd at z2 (xd, yd, z2). This image data is transmitted to a condenser part drive control unit 25, and analyzing the data calculates a light diameter (diameter of a light flux) at z2 and further calculates coordinates providing the largest light intensity or center coordinates (x2, y2) of a region having the largest light intensity as an actual optical axis coordinates (x2, y2, z2) at z2, for example. The image data may be obtained by scanning the predetermined region (for example, 2 by 2 cm square) with the first focus-position monitor 21a in the x-direction and the y-direction.

Further, as shown in FIG. 6, the second focus-position monitor 21b is raised to cross the reference optical axis OAd at a predetermined position in the z-direction which is the extension direction of the reference optical axis OAd (z-coordinate of this point is denoted by z3) and obtains the image data of a predetermined region (for example, 2 by 2 cm square) having the center at the point of the x-coordinate and the y-coordinate of the reference optical axis OAd at z3, that is, (xd, yd, z3). This image data is transmitted to a condenser part drive control unit 25, and analyzing the data calculates a light diameter at z3 and further calculates coordinates providing the largest light intensity or center coordinates (x3, y3) of a region having the largest light intensity as an actual optical axis coordinates (x3, y3, z3) at z3, for example. The image data may be obtained by scanning the predetermined region (for example, 2 by 2 cm square) with the second focus-position monitor 21b in the x-direction and the y-direction.

Further, while the configuration of the condenser part drive unit 23 does not have any particular restriction, the condenser part drive unit 23 may be configured to be a stage (mounting stage) that can move in the x, y, and z directions and the condenser part 20 may be mounted on the upper part of the stage. Further, even if the actual focus IF matches the reference focus IFd, the exposure part 30 is not irradiated with the desirable EUV light when the actual optical axis OA is shifted from the reference optical axis OAd. Accordingly, in the stage, it is necessary to dispose the stage to be rotatable around a center axis in the x-direction and dispose the stage to be rotatable around a center axis in the y-direction to correct the rotation of the actual optical axis OA. A shift amount of the focus IF includes a shift (positional shift) of the focus IF position and an angular shift (rotational shift) of the optical axis passing through the focus IF. Here, for the angular shift (rotational shift) of the optical axis, a counter clockwise rotation angle (correction rotation angle or rotational shift amount) around the center axis of the x-direction from the horizontal state is defined as $\phi 2$ and a clockwise rotation angle (correction rotation angle or rotational shift amount) around the center axis of the y-direction from the x-direction is defined as $\theta 2$.

[Adjustment method of the focus and the optical axis] First, the first focus-position monitor 21a is raised and the image data is obtained. Next, after the first focus-position monitor 21a has been lowered, the second focus-position monitor 21b is raised and the image data is obtained. Next, the second focus-position monitor 21b is lowered.

The data (image data) obtained by the first focus-position monitor 21a and the second focus-position monitor 21b is transmitted to the condenser part drive control unit 25, and actual optical axis coordinates (x2, y2, z2) at z2 and actual optical axis coordinates (x3, y3, z3) at z3 are calculated by the data analysis. Further, the data (image data) obtained by the first focus-position monitor 21a and the second focus-position monitor 21b is transmitted to the condenser part drive control unit 25, and a light diameter at z2 and a light diameter at z3 are obtained by the data analysis.

Next, a straight line (function) passing through the actual optical axis coordinates at z2 (x2, y2, z2) and the actual optical axis coordinates at z3 (x3, y3, z3) is calculated, a shift amount between the reference optical axis OAd and the function is calculated, further coordinates of the actual focus IF are obtained from a ratio of the light diameter at z2 and the light diameter at z3, for example, and a difference (shift amount) from the reference focus IFd is calculated. Then, a positional shift amount ($\Delta x$, $\Delta y$, $\Delta z$) and rotation angles (rotation amounts of the optical axis, rotational shift amounts, or correction rotation angles) $\phi 2$ and $\theta 2$ are found.

The condenser part drive unit (stage) 23 is moved according to the calculation result. For example, the condenser part drive unit 23 is moved in the x-direction by $\Delta x$, in the y-direction by $\Delta y$, and further in the z-direction by $\Delta z$. Further, the stage is rotated around the center axis of the x-direction by $\phi 2$ and further rotated around the center axis of the y-direction by $\theta 2$.

Figure 7:
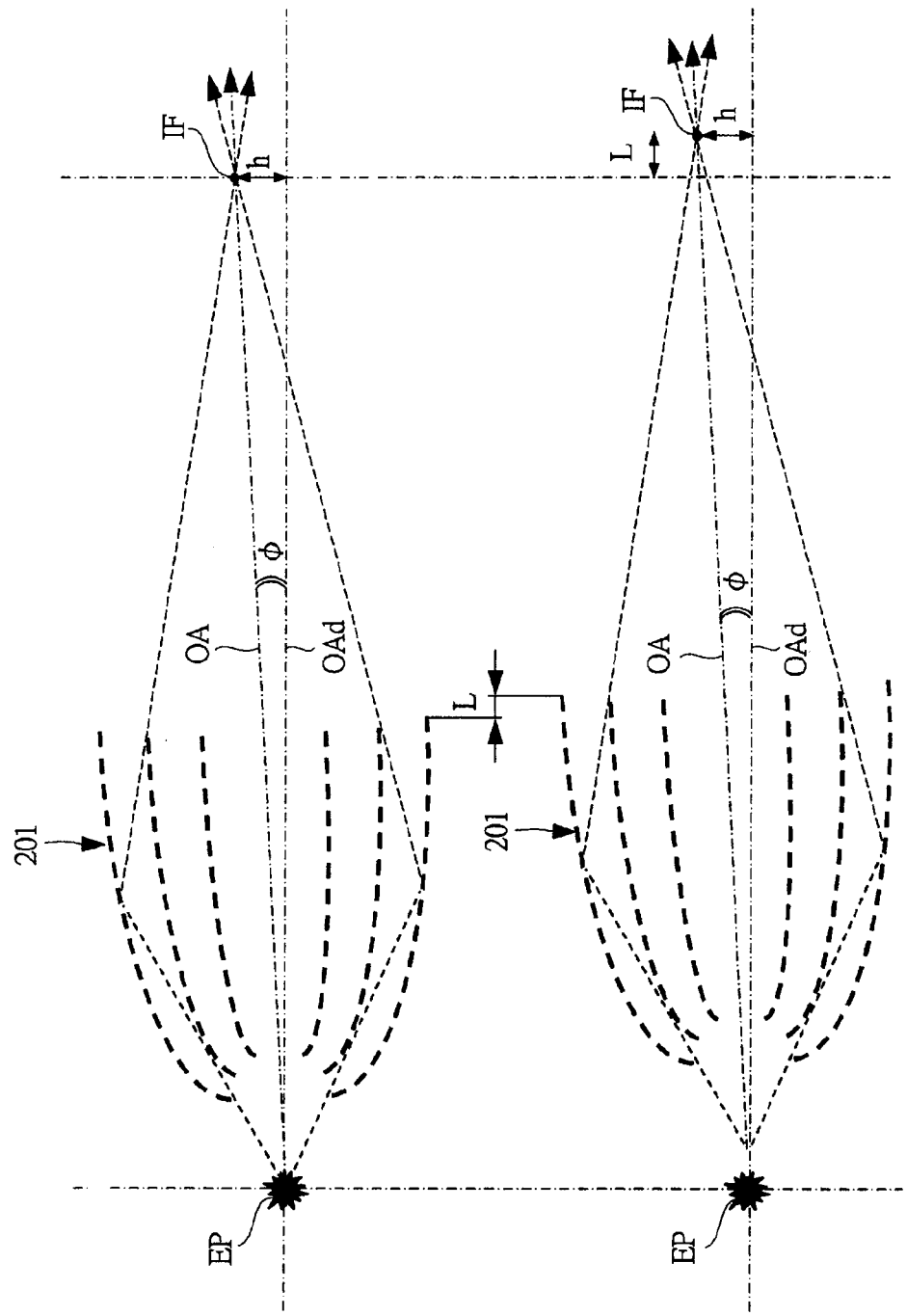
FIG. 7 is a diagram showing an example of an adjustment method for an actual optical axis in embodiment 1.

FIG. 7 is a diagram showing an example of the adjustment method of the actual optical axis in the present embodiment. For example, as shown in the upper drawing of FIG. 7, when the actual optical axis OA is inclined to the reference optical axis OAd by $\phi$ degrees, inclining the stage by $-\phi$ degrees can bring the actual optical axis OA closer to the reference optical axis OAd. Further, when the shift amount $\Delta z$ is $+L$ in addition to the inclination of $\phi$ degrees as shown in the lower drawing of FIG. 7, inclining the stage by $-\phi$ degrees and further making the stage closer to the light emission part 10 by L can bring the actual optical axis OA closer to the reference optical axis OAd and also bring the focus IF closer to the reference focus IFd.

In this manner, moving the position of the condenser part 20 can adjust (correct) to bring the position of the actual focus IF closer to the reference focus IFd and to bring the actual optical axis OA closer to the reference optical axis OAd.

Figures 8, 9:
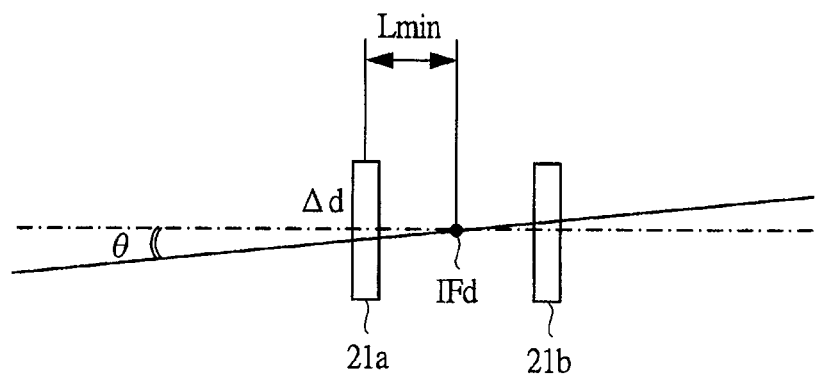
FIG. 8 is a diagram showing an example for a relationship among L, θ and φ.
FIG. 9 is a table showing examples for a relationship among L, θ and φ.
Figures 10, 11:
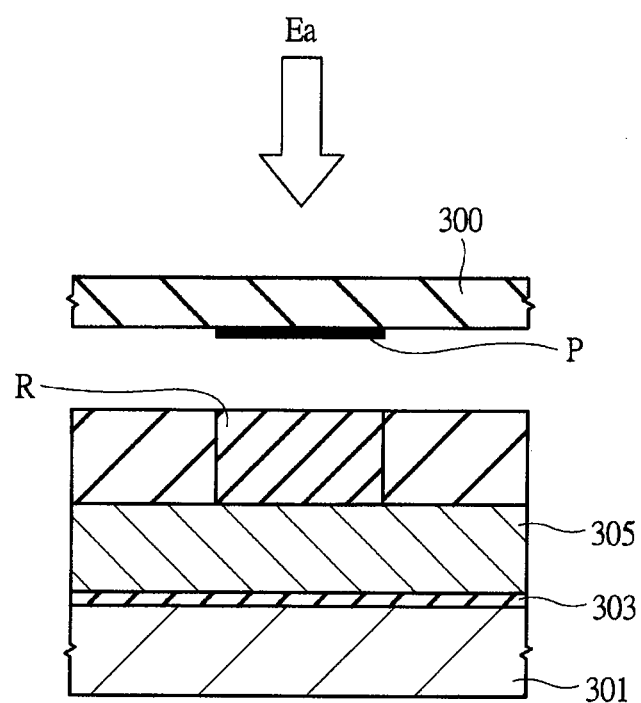
FIG. 10 is formula showing an example for a relationship among L, θ and φ.
FIG. 11 is a relevant part cross-sectional view showing a semiconductor device manufacturing step in embodiment 1.

FIG. 8 to FIG. 10 are a diagram, a table, and a formula, respectively, showing examples regarding a relationship among L, $\theta$, and $\phi$. With reference to FIG. 8 to FIG. 10, an example of L, $\theta(\theta 2)$, and $\phi(\phi 2)$ is explained. The following explanation illustrates numerical values which L, $\theta$, and $\phi$ can be, and the technique in the present embodiment is not limited to the following numerical values.

As shown in FIG. 8, regarding the rotation angle ($\theta 2$), when a resolution power $\Delta d$ in each of the focus-position monitors (21a and 21b) is 0.25 mm, for example, it is necessary to dispose the focus-position monitors (21a and 21b) at positions which are apart from the z-coordinate of the reference focus IFd by 143.2 mm or more to detect an inclination ($\theta=0.1$ degrees) of the actual optical axis OA to the reference optical axis OAd. Lmin indicates the distance from the z-coordinate of the reference focus IFd. FIG. 9 shows a relationship between the above $\theta$ and Lmin.

Further, as shown in FIG. 10, regarding the rotation angle (φ2), φ in FIG. 7 is expressed by a function of Lmin and Δh (difference of h in FIG. 7). For example, when L is 9 mm and Δh (difference of h in FIG. 7) is 0.5 mm, φ is approximately 3.2 degrees (refer to FIG. 7).

Figure 12:
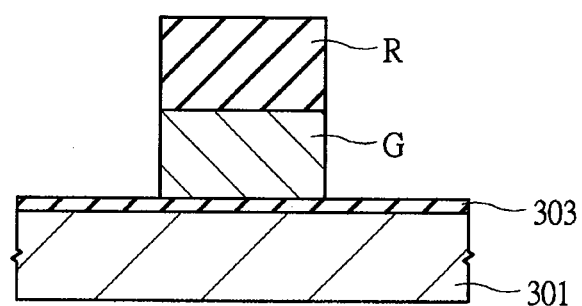
FIG. 12 is a relevant part cross-sectional view showing a semiconductor device manufacturing step in embodiment 1 and a relevant part cross-sectional view of a semiconductor device manufacturing step succeeding the manufacturing step of FIG. 11.
Figure 13:
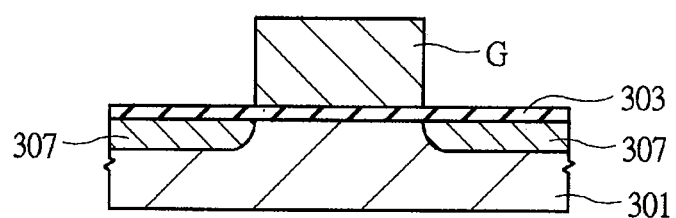
FIG. 13 is a relevant part cross-sectional view showing a semiconductor device manufacturing step in embodiment 1 and a relevant part cross-sectional view of a semiconductor device manufacturing step succeeding the manufacturing step of FIG. 12.

[Manufacturing method of a semiconductor device] Successively, a manufacturing method of a semiconductor device of the present embodiment, specifically, a step of irradiating a substrate via a reticle with the EUV light in the exposure part, is explained with reference to FIG. 11 to FIG. 13. FIG. 11 to FIG. 13 are cross-sectional views of the relevant parts showing the manufacturing method of the semiconductor device of the present embodiment. In the manufacturing step of the semiconductor device, the detectors such as the above described monitors (21a and 21b) do not exist on the optical axis OA and the exposure part 30 is irradiated with the adjusted EUV light.

For example, as shown in FIG. 11, a semiconductor substrate (substrate) 301 having a conductive film 305 deposited over via a gate insulating film 303 is prepared. A photo-resist film (photo-sensitive insulating film) R is formed over the entire surface of this semiconductor substrate 301, and exposure is performed by using the EUV light which has been adjusted by the adjustment method explained in the above "Adjustment method of the emission point" and "Adjustment method of the focus and the optical axis" (hereinafter, adjusted EUV light Ea).

Specifically, as shown in FIG. 11, a pattern P depicted on a reticle 300 is transferred by irradiating the photo-resist film (photo-sensitive film) R with the adjusted EUV light Ea via the reticle 300. The irradiation with this adjusted EUV light (corrected EUV light) Ea changes a film property of an irradiated part, such as hardening the irradiated part. Next, as shown in FIG. 12, a predetermined developer removes the photo-resist film except the hardened part, and the lower layer conductive film is etched by using the remaining photo-resist film as a mask to form a gate electrode G, for example. Next, as shown in FIG. 13, a source-drain region 307 is formed by introducing impurity ions into the semiconductor substrate on both sides of the gate electrode G.

The formation step of a MISFET (Metal Insulator Semiconductor Field Effect Transistor) has been explained. The above described adjusted EUV light Ea can be employed in a photo-lithography step of various constructional elements which can configure a semiconductor device.

In this manner, the adjusted EUV light Ea is exposure light having a short wavelength, has improved intensity, can improve resolution, and perform desired fine processing. For example, fining a gate length can drive the MISFET at a low voltage and can improve the operation speed. Further, higher integration in the MISFET can improve the element (device) characteristics. Moreover, improving the exposure light intensity can reduce exposure time of the photo-resist film. This increases the number of exposures (number of shots) per a unit time and improves the throughput in the semiconductor device manufacturing.

As explained above in detail, the exposure apparatus of the present embodiment provides the monitor detecting the position of the emission point and the drive part adjusting the position of the light emission part and can adjust the position of the emission point of the EUV light. Further, the monitor detecting the position of the focus and the drive part adjusting the position of the condenser part are provided, and then the focus position of the EUV light can be adjusted. As a result, the adjusted EUV light having a short wavelength and a high intensity can be used in the exposure and the exposure characteristics can be improved. Specifically, the resolution can be improved and the exposure time can be reduced.

Further, by manufacturing a semiconductor device with the above exposure apparatus and exposure method, the resolution can be improved, and then a preferable semiconductor device with the semiconductor characteristics improved can be manufactured. Moreover, reducing the exposure time can improve the throughput.

(Embodiment 2) Although the above embodiment 1 adjusts the focus and the optical axis by using the two focus-position monitors, the present invention is not limited to such a configuration and various configurations and adjustment methods in the following application examples may be employed.

APPLICATION EXAMPLE 1

Figure 14:
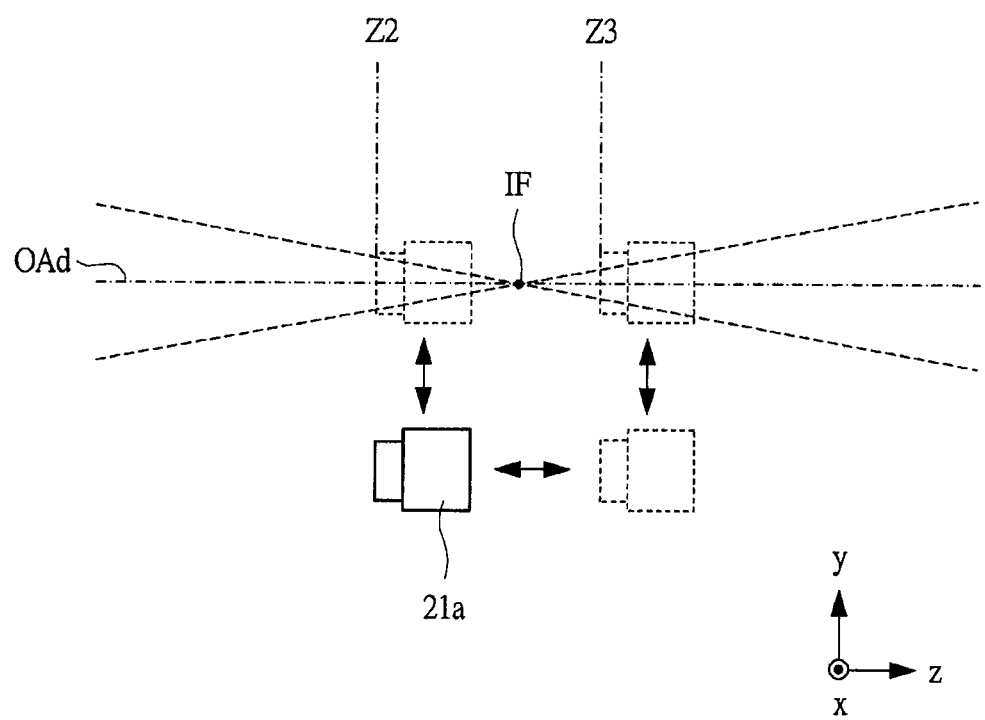
FIG. 14 is a diagram showing a configuration in the vicinity of a focus in an exposure apparatus of application example 1 in embodiment 2.

Although embodiment 1 detects the data by using the two focus-position monitors (first focus-position monitor and second focus-position monitor), the data may be detected at two positions by scanning in the z-direction with one focus-position monitor. FIG. 14 is a diagram showing a configuration near the focus in an exposure apparatus of application example 1 in embodiment 2. The configuration except a "configuration in the peripheral of the focus IF" is the same as that of embodiment 1 and its explanation is omitted.

[Configuration in the peripheral of the focus IF] In present application example 1, the first focus-position monitor 21a is disposed near the focus IF.

The first focus-position monitor 21a is disposed below the reference optical axis OAd. The z-coordinate (position in the z-direction) of this first focus-position monitor 21a may be disposed at either the condenser part 20 side or the exposure part 30 side of the z-coordinate (zd2) of the reference focus IFd. A CCD camera can be used as this first focus-position monitor 21a, for example.

The first focus-position monitor 21a is disposed so that it can move up and down (vertically), and raised up to near the reference optical axis OAd and detects data (for example, image data showing a cross section of light flux near the vicinity of the reference optical axis OAd).

Although the detection method does not have any particular restriction, for example, as shown in FIG. 14, the first focus-position monitor 21a is raised so that it crosses the reference optical axis OAd at a predetermined position in the z-direction which is the extension direction of the reference optical axis OAd (z-coordinate of this point is denoted by z2) and obtains the image data of a predetermined region (for example, 2 by 2 cm square) having the center at the point of the x-coordinate and the y-coordinate of the reference optical axis OAd at z2 (xd, yd, z2). This image data is transmitted to the condenser part drive control unit 25, and, by analyzing the data, the shape of a cross section of light flux and coordinates providing the largest light intensity or the center of a region having the largest light intensity are detected as an actual optical axis coordinates (x2, y2, z2) at z2. The image data of the predetermined region may be obtained by scanning the predetermined region (for example, 2 by 2 cm square) with the first focus-position monitor 21a in the x-direction and the y-direction.

Further, the first focus-position monitor 21a is disposed so that it can be moved in the z-direction (right and left) and, for example, can be moved from a predetermined position in the z-direction (z-coordinate of this position is denoted by z2) to another predetermined position in the z-direction (z-coordinate of this position is denoted by z3) in the state in which the first focus-position monitor 21a has been lowered.

Thereby, the first focus-position monitor 21a is raised so that it crosses the reference optical axis OAd at the another predetermined position in the z-direction (z-coordinate of this position is denoted by z3) and obtains the image data of a predetermined region (for example, 2 by 2 cm square) having the center at the point of the x-coordinate and the y-coordinate of the reference optical axis OAd at z3 (xd, yd, z3). This image data is transmitted to the condenser part drive control unit 25, and, by analyzing the data, a shape of a cross section of light flux cross and coordinates providing the largest light intensity or the center of a region having the largest light intensity are detected as an actual optical axis coordinates (x3, y3, z3) at z3. The image data of the predetermined region may be obtained by scanning the predetermined region (for example, 2 by 2 cm square) with the first focus-position monitor 21a in the x-direction and the y-direction.

[Adjustment method of the focus and the optical axis] Next, an adjustment method of the focus and the optical axis is explained. First, the first focus-position monitor 21a is raised at the position z2 and the image data is obtained there. Next, the first focus-position monitor 21a is lowered and moved from the position z2 to the position z3, and then the first focus-position monitor 21a is raised at the position z3 and the image data is obtained there. Next, the first focus-position monitor 21a is lowered.

The data (image data) obtained by the first focus-position monitor 21a is transmitted to the condenser part drive control unit 25 and, by analyzing the data, the actual optical axis coordinates (x2, y2, z2) at z2 and the actual optical axis coordinate (x3, y3, z3) at z3 are calculated. Further, the data (image data) obtained by the first focus-position monitor 21a is transmitted to the condenser part drive control unit 25, and, by analyzing the data, a light diameter at z2 and a light diameter at z3 are obtained.

Next, a straight line (function) passing through the actual optical axis coordinates at z2 (x2, y2, z2) and the actual optical axis coordinates at z3 (x3, y3, z3) is calculated, a shift amount between the reference optical axis OAd and the function is calculated, further coordinates of the actual focus IF are obtained from a ratio of the light diameter at z2 and the light diameter at z3, for example, and a difference (shift amount) from the reference focus IFd is calculated. Then, a positional shift amount ($\Delta x$, $\Delta y$, $\Delta z$) and rotation angles (rotational shift amounts or correction rotation angles) $\phi 2$ and $\theta 2$ are found.

The condenser part drive unit (stage) 23 is moved according to the calculation result as explained in detail in embodiment 1. For example, the condenser part drive unit 23 is moved in the x-direction by $\Delta x$, in the y-direction by $\Delta y$, and further in the z-direction by $\Delta z$. Further, the stage is rotated around the center axis of the x-direction by $\phi 2$ and rotated around the center axis of the y-direction by $\theta 2$.

In this manner, moving the position of the condenser part 20 can adjust (correct) to bring the position of the actual focus IF closer to the reference focus IFd and to bring the actual optical axis OA closer to the reference optical axis OAd.

The exposure method of the present application example except the above described adjustment method is the same as that of the above described embodiment 1 and its explanation is omitted. Further, using the above described exposure apparatus and exposure method can manufacture a semiconductor device as in embodiment 1.

APPLICATION EXAMPLE 2

Figure 15:
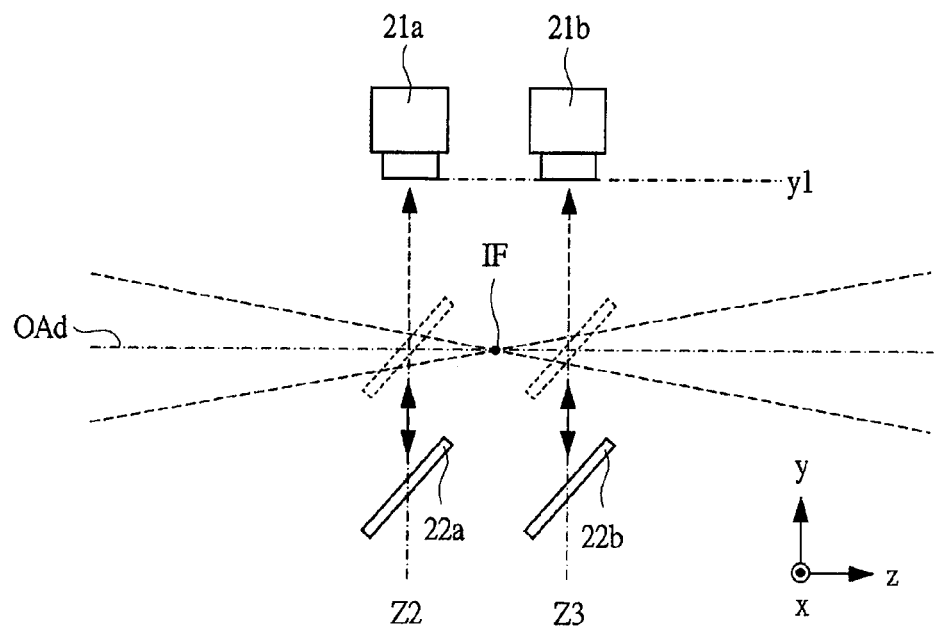
FIG. 15 is a diagram showing a configuration in the vicinity of a focus in an exposure apparatus of application example 2 in embodiment 2.

While, in embodiment 1, the focus-position monitors (first focus-position monitor and second focus-position monitor) are raised up to near the reference optical axis OAd and directly detects the data (e.g., image data showing a cross section of light flux near the reference optical axis OAd), the focus-position monitors may detect the data of reflected light by using a reflection mirror. FIG. 15 is a diagram of a configuration near the focus in an exposure apparatus of application example 2 in embodiment 2. The configuration except a "configuration in the periphery of the focus IF" is the same as that of embodiment 1 and its explanation is omitted.

[Configuration in the peripheral of the focus IF] In the exposure apparatus of present application example 2, the first focus-position monitor 21a and the second focus-position monitor 21b, a first reflection mirror 22a, a second reflection mirror 22b are disposed near the focus IF.

The first focus-position monitor 21a is disposed above the reference optical axis OAd and on the condenser part 20 side of the second focus-position monitor 21b. Further, the second focus-position monitor 21b is disposed above the reference optical axis OAd and on the exposure part 30 side of the first focus-position monitor 21a. Preferably, the z-coordinates of the first focus-position monitor 21a and the second focus-position monitor 21b are disposed on both sides of the z-coordinate (zd2) of the reference focus IFd. A CCD camera can be used as each of these focus-position monitors 21a and 21b, for example.

The first reflection mirror 22a is disposed so that it can be moved up and down (vertically) and raised up to near the reference optical axis OAd to reflect the EUV light in the upper direction (direction of the first focus-position monitor 21a). The data of this reflected light (image data showing a cross section of light flux of the reflected light) is detected by the first focus-position monitor 21a.

The second reflection mirror 22b is disposed so that it can be moved up and down (vertically) and raised up to near the reference optical axis OAd to reflect the EUV light in the upper direction (direction of the second focus-position monitor 21b). The data of this reflected light (image data showing a cross section of light flux of the reflected light) is detected by the second focus-position monitor 21b.

While the detection method does not have any particular restriction, for example, as shown in FIG. 15, the first reflection mirror 22a is disposed at an angle of 45 degrees to the reference optical axis OAd and raised so that it crosses the reference optical axis OAd at a predetermined position in the z-direction which is the extension direction of the reference optical axis OAd (z-coordinate of this position is denoted by z2). As a result, the EUV light is reflected in the upper direction and the first focus-position monitor 21a obtains the image data of the reflected light. For example, the first focus-position monitor 21a obtains the image data of a predetermined region (for example, 2 by 2 cm square) having the center at the position (xd, yd, z2). This image data is transmitted to the condenser part drive control unit 25 and, by analyzing the data, a light diameter at z2 is calculated and further coordinates providing the largest light intensity or center coordinates of a region having the largest intensity is calculated as actual optical axis coordinates (x2, y2, z2) at z2, for example. The image data of the predetermined region may be obtained by scanning the predetermined region (for example, 2 by 2 cm square) with the first focus-position monitor 21a in the x-direction and the z-direction.

Further, the second reflection mirror 22b is disposed at an angle of 45 degrees to the reference optical axis OAd and raised so that it crosses the reference optical axis OAd at a predetermined position in the z-direction which is the extension direction of the reference optical axis OAd (z-coordinate of this position is denoted by z3). As a result, the EUV light is reflected in the upper direction and the second focus-position monitor 21b obtains the image data of the reflected light. For example, the second focus-position monitor 21b obtains the image data of a predetermined region (for example, 2 by 2 cm square) having the center at the position (xd, yd, z3). This image data is transmitted to the condenser part drive control unit 25 and, by analyzing the data, a light diameter at z3 is calculated and further coordinates providing the largest light intensity or center coordinates of a region having the largest intensity is calculated as actual optical axis coordinates (x3, y3, z3) at z3, for example. The image data of the predetermined region may be obtained by scanning the predetermined region (for example, 2 by 2 cm square) with the second focus-position monitor 21b in the x-direction and the z-direction.

Further, the second focus-position monitor 21b may be omitted and the image data of the reflected light from the second reflection mirror 22b may be obtained by the first focus-position monitor 21a by moving the first focus-position monitor 21a to the position z3.

[Adjustment method of the focus and the optical axis] Next, an adjustment method of the focus and the optical axis is explained. First, the first reflection mirror 22a is raised and the image data is obtained by the first focus-position monitor 21a. Next, after the first reflection mirror 22a has been lowered, the second reflection mirror 22b is raised and the image data is obtained by the second focus-position monitor 21b. Next, the second reflection mirror 22b is lowered.

The data (image data) obtained by the first focus-position monitor 21a and the second focus-position monitor 21b is transmitted to the condenser part drive control unit 25 and, by analyzing the data, the actual optical axis coordinates at z2 (x2, y2, z2) and the actual optical axis coordinates at z3 (x3, y3, z3) are calculated. Further, the data (image data) obtained by the first focus-position monitor 21a and the second focus-position monitor 21b is transmitted to the condenser part drive control unit 25 and by analyzing the data, the light diameter at z2 and the light diameter at z3 are obtained.

Next, a straight line (function) passing through the actual optical axis coordinates at z2 (x2, y2, z2) and the actual optical axis coordinates at z3 (x3, y3, z3) is calculated, a shift amount between the reference optical axis OAd and the function is calculated, further coordinates of the actual focus IF are obtained from a ratio of the light diameter at z2 and the light diameter at z3, for example, and a difference (shift amount) from the reference focus IFd is calculated. Then, a positional shift amount ($\Delta x$, $\Delta y$, $\Delta z$) and rotation angles (rotational shift amounts or correction rotation angles) $\phi 2$ and $\theta 2$ are found.

The condenser part drive unit (stage) 23 is moved according to the calculation result. For example, the condenser part drive unit 23 is moved in the x-direction by $\Delta x$, in the y-direction by $\Delta y$, and further in the z-direction by $\Delta z$. Further, the stage is rotated around the center axis of the x-direction by $\phi 2$ and further rotated around the center axis of the y-direction by $\theta 2$.

In this manner, moving the position of the condenser part 20 can adjust (correct) to bring the position of the actual focus IF closer to the reference focus IFd and to bring the actual optical axis OA closer to the reference optical axis OAd.

The exposure method of the present application example except the above described adjustment method is the same as that of the above described embodiment 1 and its explanation is omitted. Further, using the above described exposure apparatus and exposure method can manufacture a semiconductor device as in embodiment 1.

APPLICATION EXAMPLE 3

Figure 16:
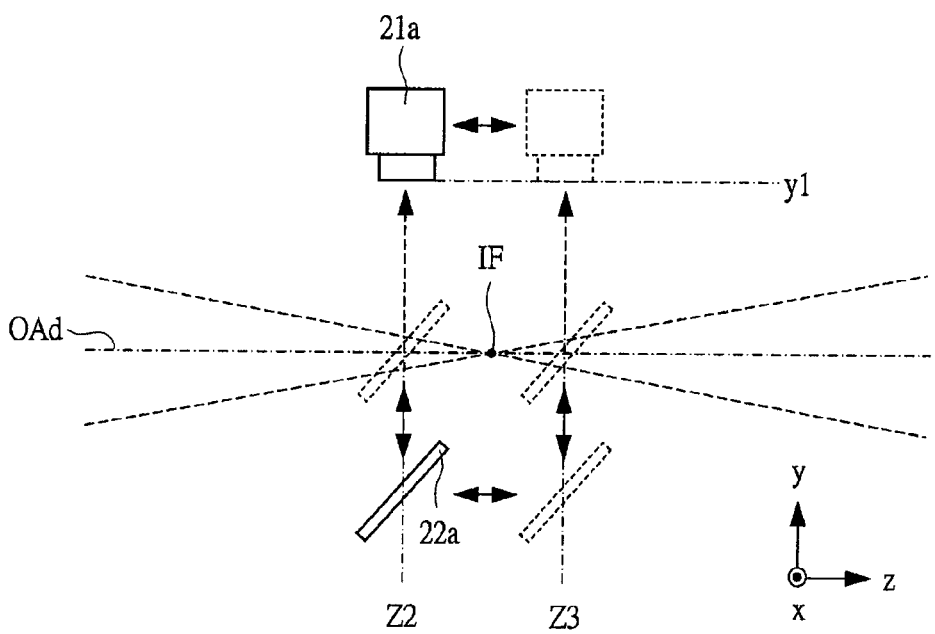
FIG. 16 is a diagram showing a configuration in the vicinity of a focus in an exposure apparatus of application example 3 in embodiment 2.

While, in the above application example 2, the two focus-position monitors 21a and 21b and the two reflection mirrors 22a and 22b are used (two sets of the focus-position monitor and the reflection mirror are used), the data may be detected by scanning the z-direction with one set (combination of one focus-position monitor and one reflection mirror). FIG. 16 is a diagram showing a configuration near the focus in an exposure apparatus of application example 3 in embodiment 2. The configuration except a "configuration in the periphery of the focus IF" is the same as that of embodiment 1 and its explanation is omitted.

[Configuration in the peripheral of the focus IF] In the exposure apparatus of present application example 3, the first focus-position monitor 21a and a first reflection mirror 22a are disposed near the focus IF.

The first focus-position monitor 21a is disposed above the reference optical axis OAd and at a position corresponding to the first reflection mirror 22a to be described below. The z-coordinate of this first focus-position monitor 21a and the first reflection mirror 22a may be disposed at either the condenser part 20 side or the exposure part 30 side from the z-coordinate of the reference focus IFd (zd2). A CCD camera can be used as this focus-position monitor 21a, for example.

The first reflection mirror 22a is disposed so that it can be moved up and down (vertically) and raised up to near the reference optical axis OAd to reflect the EUV light in the upper direction (direction of the first focus-position monitor 21a). The data of this reflected light (image data showing a cross section of light flux of the reflected light) is detected by the first focus-position monitor 21a.

While the detection method does not have any particular restriction, for example, as shown in FIG. 16, the first reflection mirror 22a is disposed at an angle of 45 degrees to the reference optical axis OAd and raised so that it crosses the reference optical axis OAd at a predetermined position in the z-direction which is the extension direction of the reference optical axis OAd (z-coordinate of this position is denoted by z2). As a result, the EUV light is reflected in the upper direction and the first focus-position monitor 21a obtains the image data of the reflected light. For example, the first focus-position monitor 21a obtains the image data of a predetermined region (for example, 2 by 2 cm square) having the center at the position (xd, yd, z2). This image data is transmitted to the condenser part drive control unit 25 and, by analyzing the data, a shape of a cross section of light flux and coordinates providing the largest light intensity or the center of a region having the largest light intensity is detected as actual optical axis coordinates at z3 (x3, y3, z3). The image data of the predetermined region may be obtained by scanning the predetermined region (for example, 2 by 2 cm square) with the first focus-position monitor 21a in the x-direction and the z-direction.

Further, the first reflection mirror 22a is disposed so that it can be moved up and down (vertically) and, for example, can be moved from a predetermined position in the z-direction (z-coordinate of this position is denoted by z2) to another predetermined position in the z-direction (z-coordinate of this position is denoted by z3) in the state in which the first reflection mirror 22a has been lowered. Further, the first focus-position monitor 21a is disposed so that it can be moved in the z-direction (light and left) and, for example, can be moved from a predetermined position in the z-direction (z-coordinate of this position is denoted by z2) to another predetermined position in the z-direction (z-coordinate of this position is denoted by z3).

[Adjustment method of the focus and the optical axis]

Next, an adjustment method of the focus and the optical axis are explained. First, the first reflection mirror 22a is raised at the position z2 and the image data is obtained by the first focus-position monitor 21a. Next, the first reflection mirror 22a is lowered and moved from the position z2 to the position z3. At this time, the first focus-position monitor 21a is also moved from the position z2 to the position z3. After that, the first reflection mirror 22a is raised at the position z3 and the image data is obtained by the first focus-position monitor 21a. Next, the first reflection mirror 22a is lowered.

The data (image data) obtained by the first focus-position monitor 21a is transmitted to the condenser part drive control unit 25 and, by analyzing the data, actual optical axis coordinates at z2 (x2, y2, z2) and actual optical axis coordinates at z3 (x3, y3, z3) are calculated. Further, the data (image data) obtained by the first focus-position monitor 21a is transmitted to the condenser part drive control unit 25 and by analyzing the data, a light diameter at z2 and a light diameter at z3 are obtained.

Next, a straight line (function) passing through the actual optical axis coordinates at z2 (x2, y2, z2) and the actual optical axis coordinates at z3 (x3, y3, z3) is calculated, a shift amount between the reference optical axis OAd and the function is calculated, further coordinates of the actual focus IF are obtained from a ratio of the light diameter at z2 and the light diameter at z3, for example, and a difference (shift amount) from the reference focus IFd is calculated. Then, a positional shift amount ($\Delta x$, $\Delta y$, $\Delta z$) and rotation angles (rotational shift amounts or correction rotation angles) $\phi 2$ and $\theta 2$ are found.

The condenser part drive unit (stage) 23 is moved according to the calculation result as explained in detail in embodiment 1. For example, the condenser part drive unit 23 is moved in the x-direction by $\Delta x$, in the y-direction by $\Delta y$, and further in the z-direction by $\Delta z$. Further, the stage is rotated around the center axis of the x-direction by $\phi 2$ and further rotated around the center axis of the y-direction by $\theta 2$.

In this manner, moving the position of the condenser part 20 can adjust (correct) to bring the position of the actual focus IF closer to the reference focus IFd and to bring the actual optical axis OA closer to the reference optical axis OAd.

The exposure method of the present application example except the above described adjustment method is the same as that of the above described embodiment 1 and its explanation is omitted. Further, using the above described exposure apparatus and exposure method can manufacture a semiconductor device as in embodiment 1.

APPLICATION EXAMPLE 4

While, in the above described embodiment 1 and embodiment 2, the image data is obtained at two positions and a positional shift amount ($\Delta x$, $\Delta y$, $\Delta z$) and rotation angles $\phi 2$ and $\theta 2$ are calculated, the shift amount ($\Delta x$, $\Delta y$, $\Delta z$) and the rotation angles (rotational shift amounts or correction rotation angles) $\phi 2$ and $\theta 2$ may be calculated from the image data of one position.

For example, in embodiment 1 and application example 3 in embodiment 2, the image data is obtained at the position z2 and actual optical axis coordinates (x2, y2, z2) are calculated by analyzing the data. Further, a shape of a cross section of light flux (outline) is obtained by analyzing the data. An actual optical axis OA is calculated by the analysis how this shape of the cross section is distorted from a true circle (extent of distortion) and a shift amount from the function of the reference optical axis OAd is calculated. Thereby, a shift amount ($\Delta x$, $\Delta y$, $\Delta z$) and rotation angles (rotational shift amounts or correction rotation angles) $\phi 2$ and $\theta 2$ are found.

In this manner, it is possible to calculate the shift amount ($\Delta x$, $\Delta y$, $\Delta z$) and the rotation angles $\phi 2$ and $\theta 2$ also from the image data of one position. Embodiment 1 can omit the configuration of the second focus-position monitor 21b. Further, application example 3 in embodiment 2 can omit the configuration of the second focus-position monitor 21b and the second reflection mirror 22b.

The shift amount can be calculated simpler and more accurately in the calculation using the image data of two positions. In particular, by using the image data of respective two positions (two points) on both sides of the z-coordinate (zd2) of the reference focus IFd, the shift amount can be calculated simpler and more accurately.

APPLICATION EXAMPLE 5

Figure 17:
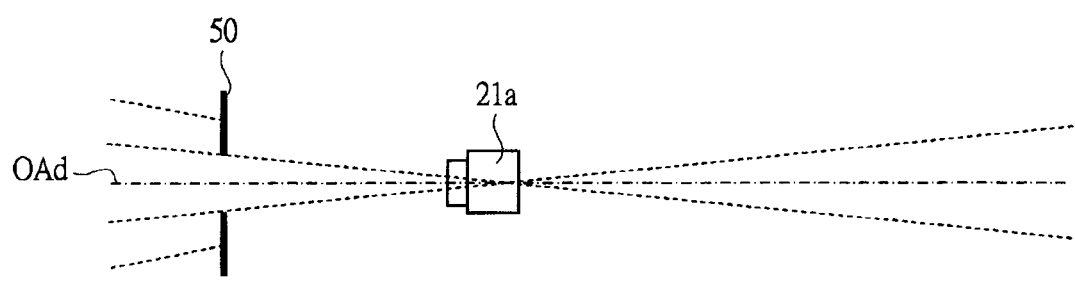
FIG. 17 is a diagram showing a configuration in the vicinity of a focus in an exposure apparatus of application example 5 in embodiment 2.

FIG. 17 is a diagram showing a configuration near the focus in an exposure apparatus of application example 5 in the present embodiment. In the present application example, a variable aperture 50 is disposed on the light receiving side (light emission part 10 side) of the first focus-position monitor 21a.

In this manner, obtaining the data (for example, image data showing a cross section of light flux) via the variable aperture 50 can prevent image blurring and obtain clearer image data.

This variable aperture 50 may be disposed on the light receiving side (light emission part 10 side) of the second focus-position monitor 21b.

For example, the variable apertures may be disposed on the light receiving sides (light emission part 10 sides) of the first and second focus-position monitors 21a and 21b, and may be disposed so that it can be moved up and down as the first and second focus-position monitors 21a and 21b.

Further, the variable apertures may be disposed on the light receiving sides (light emission part 10 sides) of the two focus-position monitors 21a and 21b in application 2 of embodiment 2 and the reflection light from the reflection mirror 22a and 22b may received via the variable apertures, respectively.

APPLICATION EXAMPLE 6

Figure 18:
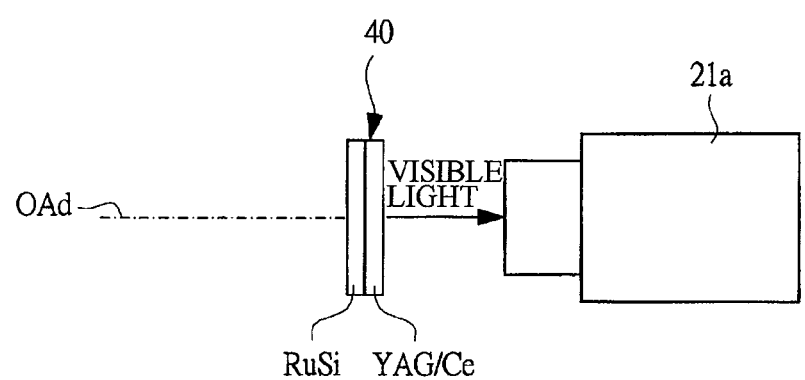
FIG. 18 is a diagram showing a configuration in the vicinity of a focus in an exposure apparatus of application example 6 in embodiment 2.

FIG. 18 is a diagram showing a configuration near the focus in an exposure apparatus of application example 6 in the present embodiment. In the present application example, a filter 40 is disposed on the light receiving side (light emission part 10 side) of the first focus-position monitor 21a.

In this manner, wavelength-converted data (for example, image data showing a cross section of light flux) may be obtained by visualization or the like of the EUV light via the filter 40. A stacked filter including a first filter composed of a stacked film of Ru (ruthenium) and Si (silicon) and a second filter composed of a stacked film of YAG (Yttrium Aluminum Garnet) and Ce (cerium) can be used as the visualization filter. For example, the EUV light is converted into visible light by the first filter and the second filter, and this visible light is detected by the first focus-position monitor 21a in embodiment 1, for example, and the data is obtained. This filter 40 may be disposed on the light receiving side (light emission part 10 side) of the second focus-position monitor 21b.

The visualization filters may be disposed on the light receiving sides (light emission part 10 sides) of the first and second focus-position monitors 21a and 21b in embodiment 1, respectively. These visualization filters may be disposed on the lens surfaces of the first and second focus-position monitors 21a and 21b, respectively, and further may be disposed so that it can be moved up and down as the first and second focus-position monitors 21a and 21b.

Further, the visualization filters may be disposed on the light receiving sides (light emission part 10 sides) of the two focus-position monitors 21a and 21b in application example 2 of embodiment 2, respectively, and the reflection light from the reflection mirrors 22a and 22b may be received via the visualization filters, respectively.

APPLICATION EXAMPLE 7

While adjustment timing of the light emission part (emission point EP) 10 and the condenser part (focus IF) 20 do not have any particular restriction, an adjustment frequency is preferably increased, such as adjusted, each time when a predetermined number of wafers have been exposed.

Further, regarding the adjustment timing of the condenser part 20, the material composing the condenser part 20 could be deformed by the heat of the plasma excitation. Accordingly, a temperature sensor detects the temperature of the condenser part 20 and the position of the condenser part 20 may be adjusted when the condenser part 20 reaches a temperature higher than a predetermined value.

(Embodiment 3) While, in embodiment 1 and embodiment 2, the light emission part 10 is explained using the DPP (Discharge Produced Plasma) light emission part as an example, the plasma light emission method does not have any particular restriction and the present invention can be applied to an exposure apparatus and exposure method including an LPP (Laser Produced Plasma) light emission part, for example, and applied to a manufacturing method of a semiconductor device using these exposure apparatus and exposure method.

Figure 19:
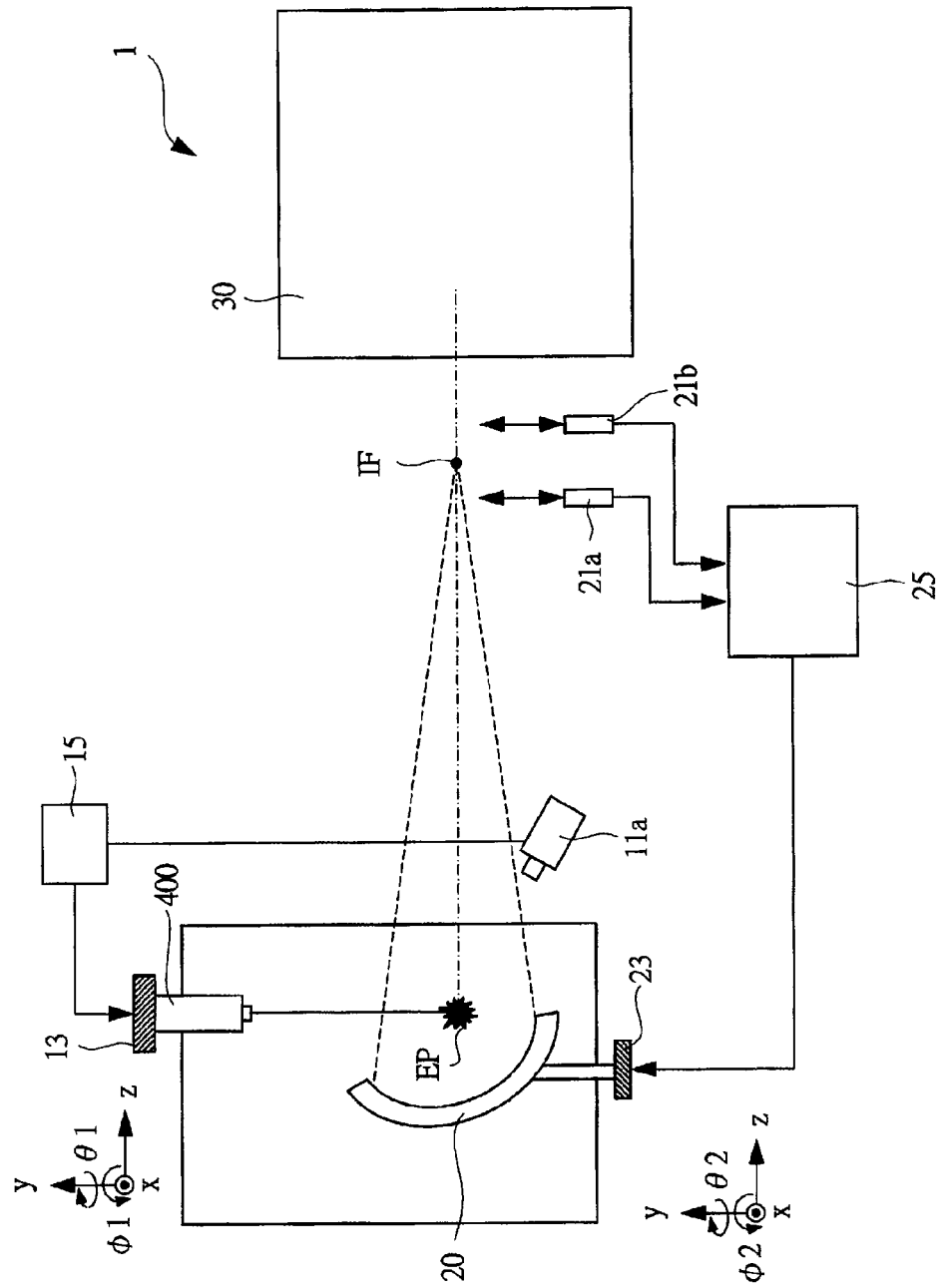
FIG. 19 is a block diagram showing a configuration of an exposure apparatus used for semiconductor device production in embodiment 3.

FIG. 19 is a block diagram showing a configuration of an exposure apparatus used to manufacture the semiconductor device in the present embodiment.

In the LPP light emission method, as shown in FIG. 19, light is emitted by irradiating a target (for example, melted Sn or the like) dropped from an LPP light emission part (target drop part in the present embodiment) 400 with laser from a laser emission part, which is not in the drawing, to excite plasma. EP indicates an emission point.

In this manner, when the LPP light emission part 400 is employed, as shown in FIG. 19, the condenser part 20, the LPP light emission part (light emission part) 400, and the exposure part 30 are disposed in this order. The LPP light emission part 400 is disposed between the condenser part 20 and the exposure part 30.

Also in this case, the same advantage as that of embodiment 1 can be obtained by adjusting the position of the condenser part 20 or the LPP light emission part (target drop part in the present embodiment) 400 as same as in embodiment 1.

Further, the various application examples, which are explained in embodiment 2, can be applied to the present embodiment, too.

While, the invention achieved by the present inventors has been explained according to the embodiments, the present invention is not limited to the embodiments and can be modified variously in a range without departing from the purport of the invention.

The present invention relates to a manufacturing method of a semiconductor device, an exposure method, and an exposure apparatus and, in particular, is applied effectively to a semiconductor device manufacturing technique having an exposure step using EUV light.

What is claimed is:

1. A manufacturing method of a semiconductor device, comprising the steps of:
 (a) preparing an exposure apparatus which includes
  (a1) a light emission part generating EUV light by plasma excitation of a predetermined atom,
  (a2) a condenser part condensing the EUV light emitted from the light emission part,
  (a3) an exposure part irradiating a substrate via a mask with the EUV light condensed by the condenser part,
  (a4) a monitor detecting a position of an emission point of the EUV light within the light emission part, and
  (a5) a drive part adjusting a position of the light emission part;
 (b) adjusting the exposure apparatus; the adjusting step including the steps of,
  (b1) generating the EUV light in the light emission part,
  (b2) detecting the emission point of the EUV light by the monitor,
  (b3) calculating a shift amount between the emission point and a reference emission point, and
  (b4) adjusting the position of the emission point of the EUV light by driving the drive part according to a calculation result of the shift amount; and
 (c) exposing a light sensitive film formed above the substrate, the exposing step, after the (b4) step, guiding corrected EUV light, which has been emitted from the light emission part and condensed by the condenser part, to the exposure part to expose the light sensitive film within the exposure part.

2. The manufacturing method of a semiconductor device according to claim 1, wherein
 the predetermined atom is Xe (xenon) or Sn (tin).

3. The manufacturing method of a semiconductor device according to claim 1, wherein
 the condenser part is disposed between the light emission part and the exposure part.

4. The manufacturing method of a semiconductor device according to claim 1, wherein
 the light emission part is disposed between the condenser part and the exposure part.

5. The manufacturing method of a semiconductor device according to claim 1, wherein
 the monitor includes a first monitor and a second monitor, and detects an x-coordinate and a y-coordinate of the position of the emission point with the first monitor and detects a z-coordinate of the position of the emission point with the second monitor.

6. The manufacturing method of a semiconductor device according to claim 1, wherein
 the monitor is disposed outside the light emission part and detects the position of the emission point of the EUV light via a window provided for the light emission part.

7. The manufacturing method of a semiconductor device according to claim 1, wherein
 the monitor detects the position of the emission point of the EUV light via a filter.

8. A manufacturing method of a semiconductor device, comprising the steps of:
 (a) preparing an exposure apparatus which includes
  (a1) a light emission part generating EUV light by plasma excitation of a predetermined atom,
  (a2) a condenser part condensing the EUV light emitted from the light emission part,
  (a3) an exposure part irradiating a substrate via a mask with the EUV light condensed by the condenser part (a4) a monitor detecting a position of a focus of the EUV light condensed by the condenser part, and (a5) a drive part adjusting a position of the condenser part;

(b) adjusting the exposure apparatus, the adjusting step including the steps of, (b1) generating the EUV light in the light emission part, (b2) detecting the focus of the EUV light by the monitor, (b3) calculating a shift amount between the focus and a reference focus, and (b4) adjusting the position of the focus of the EUV light by driving the drive part according to a calculation result of the shift amount; and (c) exposing a light sensitive film formed above the substrate, the exposing step, after the (b4) step, guiding corrected EUV light, which has been emitted from the light emission part and condensed by the condenser part, to the exposure part to expose the light sensitive film within the exposure part.

9. The manufacturing method of a semiconductor device according to claim 8, wherein the predetermined atom is Xe (xenon) or Sn (tin).

10. The manufacturing method of a semiconductor device according to claim 8, wherein the condenser part is disposed between the light emission part and the exposure part.

11. The manufacturing method of a semiconductor device according to claim 8, wherein the light emission part is disposed between the condenser part and the exposure part.

12. The manufacturing method of a semiconductor device according to claim 8, wherein, in the exposure apparatus, a reference optical axis which is defined by a reference emission point in the light emission part and the reference focus of the condenser part is set preliminarily, and the monitor is disposed below the reference optical axis and raised up to near the reference optical axis to detect the focus from a position of an actual optical axis.

13. The manufacturing method of a semiconductor device according to claim 12, wherein the monitor includes a first monitor and a second monitor, and wherein the (b3) step raises the first monitor up to near the reference optical axis at a first position in a z-direction parallel to the reference optical axis to detect respective positions of an x-coordinate and a y-coordinate of the actual optical axis, and raises the second monitor up to near the reference optical axis at a second position in the z-direction to detect respective positions of an x-coordinate and a y-coordinate of the actual optical axis, and by doing these things, detects a rotation amount of the actual optical axis with respect to the reference optical axis as the shift amount.

14. The manufacturing method of a semiconductor device according to claim 12, wherein the exposure apparatus further includes a first reflection mirror and a second reflection mirror and the monitor includes a first monitor and a second monitor, and wherein the (b3) step raises the first reflection mirror up to near the reference optical axis at a first position in a z-direction parallel to the reference optical axis and detects reflected light of the EUV light with the first monitor to detect respective positions of an x-coordinate and a y-coordinate of the actual optical axis, and raises the second reflection mirror up to near the reference optical axis at a second position in the z-direction parallel to the reference optical axis and detects the reflected light of the EUV light with the second monitor to detect respective positions of an x-coordinate and a y-coordinate of the actual optical axis, and by doing these things, detects a rotation amount of the actual optical axis with respect to the reference optical axis as the shift amount.

15. The manufacturing method of a semiconductor device according to claim 12, wherein the (b3) step, after raising the monitor up to near the reference optical axis at a first position in a z-direction parallel to the reference optical axis and firstly detecting respective positions of an x-coordinate and a y-coordinate of the actual optical axis, drives the monitor in the z-direction and raises the monitor up to near the reference optical axis at a second position in the z-direction to secondly detect respective positions of an x-coordinate and a y-coordinate of the actual optical axis, and by doing these things, detects a rotation amount of the actual optical axis with respect to the reference optical axis as the shift amount.

16. The manufacturing method of a semiconductor device according to claim 12, wherein a reflection mirror is provided, and wherein the method raises the reflection mirror up to near the reference optical axis at a first position in a z-direction parallel to the reference optical axis to firstly detect respective positions of an x-coordinate and a y-coordinate of the actual optical axis by irradiating the monitor with reflected light of the EUV light, and drives the reflection mirror in the z-direction and raises the reflection mirror up to near the reference optical axis at a second position in the z-direction to secondly detect respective positions of an x-coordinate and a y-coordinate of the actual optical axis by irradiating the monitor with the reflected light of the EUV light, and by doing these things, detects a rotation amount of the actual optical axis with respect to the reference optical axis as the shift amount.

17. The manufacturing method of a semiconductor device according to claim 12, wherein the monitor detects a position of the actual optical axis via a filter.

18. The manufacturing method of a semiconductor device according to claim 8, wherein the exposure apparatus further includes (a6) a second monitor detecting a position of an emission point of the EUV light within the light emission part, and (a7) a second drive part adjusting a position of the light emission part.

19. The manufacturing method of a semiconductor device according to claim 18, wherein the method includes, between the (b1) step and the (b2) step, the steps of:

(b5) detecting the emission point of the EUV light with the second monitor, (b6) calculating a second shift amount which is a shift amount between the emission point and a reference emission point, and (b7) adjusting a position of the emission point of the EUV light by driving the drive part according to a calculation result of the second shift amount.

20. An exposure method of an exposure apparatus, the method comprising the steps of:

determining a shift amount between an emission point detected by a monitor and a reference light emission position by using an exposure apparatus which includes: a light emission part generating EUV light by plasma excitation of a predetermined atom; a condenser part condensing the EUV light emitted from the light emission part; an exposure part irradiating a substrate via a mask with the EUV light condensed by the condenser part; the monitor detecting a position of the emission point of the EUV light within the light emission part; and a drive part adjusting a position of the light emission part; and driving the drive part according to the shift amount.

21. The exposure method of the exposure apparatus according to claim 20, wherein
the exposure apparatus further includes a second monitor detecting a position of a focus of the EUV light condensed by the condenser part and a second drive part adjusting a position of the condenser part, and wherein
the method includes the steps of calculating a second shift amount between the focus and a position of a reference focus, and driving the second drive part according to a calculation result of the second shift amount.

22. An exposure apparatus, comprising:
a light emission part generating EUV light by plasma excitation of a predetermined atom;
a condenser part condensing the EUV light emitted from the light emission part;
an exposure part irradiating a substrate via a mask with the EUV light condensed by the condenser part;
a first monitor detecting a position of an emission point of the EUV light within the light emission part; and
a first drive part adjusting a position of the light emission part, wherein
the exposure apparatus determines a first shift amount between the emission point detected by the first monitor and a reference light emission position and drives the first drive part according to the first shift amount.

23. The exposure apparatus according to claim 22, further comprising:
a second monitor detecting a position of a focus of the EUV light condensed by the condenser part; and
a second drive part adjusting a position of the condenser part, wherein
the exposure apparatus calculates a second shift amount between the focus and a position of a reference focus and drives the second drive part according to a calculation result of the second shift amount.

* * * * *